(12) United States Patent
Son et al.

(10) Patent No.: US 9,064,546 B2
(45) Date of Patent: Jun. 23, 2015

(54) MEMORY DEVICE SELECTING DIFFERENT COLUMN SELECTION LINES BASED ON DIFFERENT OFFSET VALUES AND MEMORY SYSTEM INCLUDING THE SAME

(71) Applicant: Samsung Electronics Co., Ltd., Suwon-si (KR)

(72) Inventors: Jong-Pil Son, Seongnam-si (KR); Young-Soo Sohn, Seoul (KR); Chul-Woo Park, Yongin-si (KR); Cheol-Heui Park, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 54 days.

(21) Appl. No.: 14/069,188

(22) Filed: Oct. 31, 2013

(65) Prior Publication Data

US 2014/0241098 A1 Aug. 28, 2014

(30) Foreign Application Priority Data

Feb. 26, 2013 (KR) ........................ 10-2013-0020501

(51) Int. Cl.
| | | |
|---|---|---|
| *G11C 8/10* | (2006.01) | |
| *G11C 8/06* | (2006.01) | |
| *G11C 7/12* | (2006.01) | |
| *G11C 29/18* | (2006.01) | |
| G11C 16/24 | (2006.01) | |
| G11C 29/12 | (2006.01) | |

(52) U.S. Cl.
CPC .. *G11C 8/06* (2013.01); *G11C 7/12* (2013.01); *G11C 8/10* (2013.01); G11C 16/24 (2013.01); *G11C 29/18* (2013.01); *G11C 2029/1204* (2013.01); *G11C 2029/1806* (2013.01)

(58) Field of Classification Search
CPC ............... G11C 8/06; G11C 8/10; G11C 8/12
USPC .................... 365/230.03, 230.06, 51, 63, 201
See application file for complete search history.

(56) References Cited

U.S. PATENT DOCUMENTS

| | | | |
|---|---|---|---|
| 5,995,430 A | 11/1999 | Yabe | |
| 6,097,643 A | 8/2000 | Hasegawa | |
| 6,751,121 B2 | 6/2004 | Marotta | |
| 7,038,963 B2 * | 5/2006 | Lee ............................... | 365/207 |
| 8,451,677 B2 | 5/2013 | Okahiro et al. | |
| 2003/0058689 A1 * | 3/2003 | Marotta ................... | 365/185.13 |

FOREIGN PATENT DOCUMENTS

| | | |
|---|---|---|
| JP | H 11213689 A | 8/1999 |
| JP | 2009099165 A | 5/2009 |
| JP | 2009123250 A | 6/2009 |
| KR | 1020020001877 A | 1/2002 |

* cited by examiner

*Primary Examiner* — Andrew Q Tran
(74) *Attorney, Agent, or Firm* — Muir Patent Law, PLLC

(57) ABSTRACT

A memory device may be provided which includes a memory cell array including a plurality of sub arrays each sub array having a plurality of memory cells connected to bit lines; an address buffer configured to receive a row address and a column address; and a column decoder configured to receive the column address from the address buffer and, for each of the sub arrays, to select a column selection line corresponding to the column address, from among a plurality of column selection lines, based on different offset values applied to the sub arrays, respectively. The selected column selection lines correspond to bit lines having different physical locations, respectively, according to the different offset values.

20 Claims, 12 Drawing Sheets

MEMORY DEVICE SELECTING DIFFERENT COLUMN SELECTION LINES BASED ON DIFFERENT OFFSET VALUES AND MEMORY SYSTEM INCLUDING THE SAME

CROSS-REFERENCE TO RELATED APPLICATIONS

This application claims priority under 35 U.S.C. §119 to Korean Patent Application No. 10-2013-0020501 filed on Feb. 26, 2013, the disclosure of which is incorporated by reference herein in its entirety.

BACKGROUND

Exemplary embodiments of the present disclosure relate to a semiconductor memory device, and more particularly, to a memory device and a memory system including the same.

A semiconductor memory device is a memory device which is fabricated using semiconductors such as silicon (Si), germanium (Ge), gallium arsenide (GaAs), indium phosphide (InP), and the like. Semiconductor memory devices may be classified into volatile memory devices and nonvolatile memory devices.

The volatile memory devices may lose stored contents at power-off. The volatile memory devices may include a static RAM (SRAM), a dynamic RAM (DRAM), a synchronous DRAM (SDRAM), and the like. The nonvolatile memory devices may retain stored contents even at power-off. The nonvolatile memory devices may include a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), a ferroelectric RAM (FRAM), and the like.

As a semiconductor fabricating process is developed, a semiconductor memory device may be scaled down. In particular, semiconductor memory cells may be scaled down. In this case, the probability that data stored in semiconductor memory cells scaled down is lost or an error is generated may be high. There is used a method of recovering data using a separate ECC (Error Correcting Code) to correct a data error. In general, ECC may correct error data or not depending on locations of failed memory cells.

SUMMARY

One embodiment of the disclosure is directed to provide a memory device which comprises a memory cell array including a plurality of sub arrays; an address buffer configured to receive a row address and a column address; and a column decoder configured to receive the column address from the address buffer and, for each of sub arrays, to select a column selection line corresponding to the column address, from among a plurality of column selection lines based on different offset values applied to the sub arrays, respectively. For the sub arrays, the selected column selection lines correspond to bit lines having different physical locations, respectively, according to the different offset values.

Another embodiment of the disclosure is directed to provide a memory system which comprises a plurality of memory modules each having a plurality of memory chips; and a memory controller configured to control the memory modules through a plurality of channels, respectively. Each of the memory chips is configured to select column selection lines corresponding to an address received from the memory controller. The selected column selection lines correspond to bit lines having different relative physical locations for different memory chips, and the offset values on the memory chips have different values for different memory chips according to offset values, respectively.

Still another embodiment of the disclosure is directed to provide a memory device which comprises a memory cell array including a plurality of sub arrays each having a plurality of memory cells connected to a plurality of bit lines; and a column decoder configured to receive a column address and, in each of the sub arrays, to select a column selection line connected to a corresponding bit line. A relative physical location of the bit lines corresponding to the selected column selection line within each of the sub arrays is different for different sub arrays.

BRIEF DESCRIPTION OF THE FIGURES

The above and other features of the present disclosure will become more apparent by describing in detail exemplary embodiments thereof with reference to the accompanying drawings, in which.

DETAILED DESCRIPTION

Figure 1:
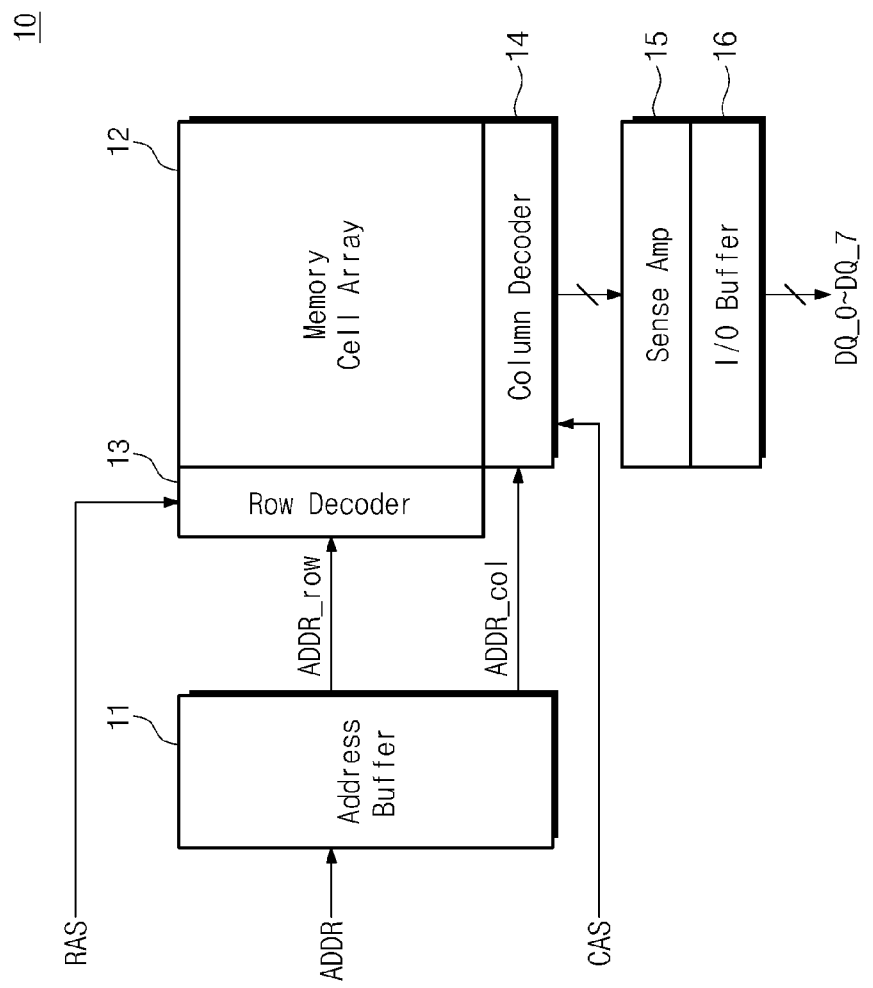
FIG. 1 is a block diagram schematically illustrating a memory device.

Exemplary embodiments of the present disclosure will be described more fully hereinafter with reference to the accompanying drawings. Like reference numerals may refer to like elements throughout the accompanying drawings.

It will be understood that, although the terms "first", "second", "third", etc., may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "under", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element or layer is referred to as being "on", "connected to", "coupled to", or "adjacent to" another element or layer, it can be directly on, connected, coupled, or adjacent to the other element or layer, or intervening elements or layers may be present.

A memory device and a memory system according to the disclosed embodiments may apply different offset values to modules, memory chips, and sub arrays to select column selection lines. Since bit lines having the same physical location are not selected together with respect to a column address, the reliability of data may be improved.

For ease of description, a memory device will be described based on a DRAM. Also, it is assumed that a memory cell array includes eight sub arrays respectively corresponding to eight data lines. Also, it is assumed that a column address corresponds to one of 128 column selection lines. However, the inventive concept is not limited thereto.

FIG. 1 is a block diagram schematically illustrating a memory device. Referring to FIG. 1, a memory device 10 may be a storage device based on a semiconductor element. For example, the memory device 10 may be a random access memory such as DRAM (Dynamic Random Access Memory), SDRAM (Synchronous DRAM), SRAM (Static RAM), DDR SDRAM (Double Date Rate SDRAM), DDR2 SDRAM, DDR3 SDRAM, PRAM (Phase-change RAM), MRAM (Magnetic RAM), RRAM (Resistive RAM) or the like. The memory device 10 may output data through data lines DQ_0 to DQ_7 in response to an address ADDR and control signals RAS and CAS received from an external device. The memory device 10 may include an address buffer 11, a memory cell array 12, a row decoder 13, a column decoder 14, a sense amplifier 15, and an input/output buffer 16.

The address buffer 11 may receive an address ADDR from an external device (e.g., a memory controller). The address ADDR may include a row address ADDR_row directing a row of the memory cell array 12 and a column address ADDR_col directing a column of the memory cell array 12. The address buffer 11 may transfer the row address ADDR_row to the row decoder 13. The address buffer 11 may transfer the column address ADDR_col to the column decoder 14.

The memory cell array 12 may include a plurality of sub arrays, each of which corresponds to at least one data line. The memory cell array 12 may include a plurality of memory cells each formed of a driving transistor and a capacitor. The memory cells may be disposed at intersections of word lines and bit lines, respectively. The memory cells may be connected to the word lines and the bit lines. The memory cells may be arranged in a matrix form. The word lines may be connected with rows of memory cells of the memory cell array 12. The bit lines may be connected with columns of memory cells of the memory cell array 12.

The row decoder 13 may select one of the word lines connected to the memory cell array 12. For example, the row decoder 13 may receive the row address ADDR_row from the address buffer 11. The row decoder 13 may select a word line, corresponding to the row address ADDR_row, from among the word lines. The row decoder 13 may activate the selected word line in response to the control signal RAS.

The column decoder 14 may select one of the bit lines connected to the memory cell array 12. For example, the column decoder 14 may receive the column address ADDR_col from the address buffer 11. The column decoder 14 may select a bit line, corresponding to the column address ADDR_col, from among the bit lines. The column decoder 14 may activate the selected bit line in response to the control signal CAS.

The sense amplifier 15 may be connected to a bit line selected by the column decoder 15. The sense amplifier 15 may sense and amplify a variation in a voltage of the selected bit line. The input/output buffer 16 may output data through the data lines DQ_0 to DQ_7 to the external device based on the amplified voltage from the sense amplifier 15.

Figure 2:
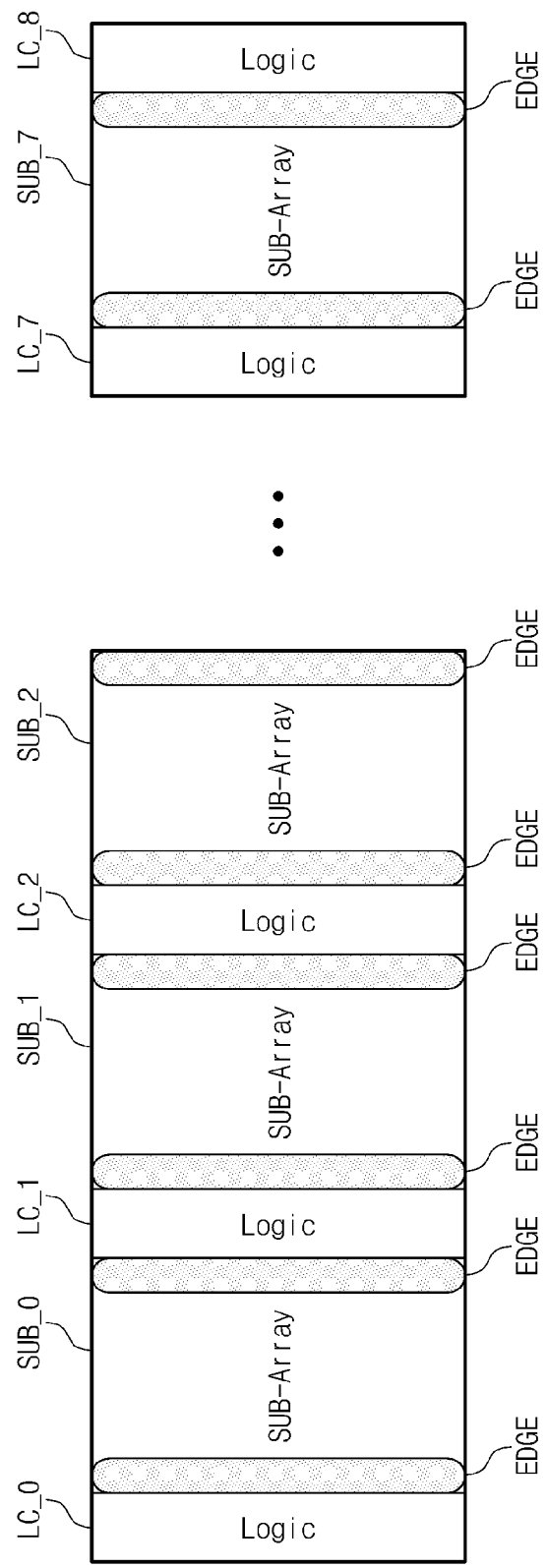
FIG. 2 is a diagram schematically illustrating a memory cell array in FIG. 1.

FIG. 2 is a diagram schematically illustrating a memory cell array in FIG. 1. Referring to FIG. 2, a memory cell array 12 may include a plurality of sub arrays SUB_0 to SUB_7 and a plurality of logic circuits LC_0 to LC_8. The sub arrays SUB_0 to SUB_7 may include a plurality of memory cells. Each of the sub arrays SUB_0 to SUB_7 may correspond to at least one data line. For example, in the event that data lines respectively corresponding to the sub arrays SUB_0 to SUB_7 are different from one another, a memory device 10 may output data through eight data lines DQ_0 to DQ_7 with respect to one address.

The logic circuits LC_0 to LC_8 may be, for example, word line driver circuits for driving sub word lines connected to the sub arrays SUB_0 to SUB_7. For example, each of the sub arrays SUB_0 to SUB_7 may be connected to a plurality of sub word lines. Each of the logic circuits LC_0 to LC_8 may activate a sub word line corresponding to a word line activated by a row decoder 13.

The sub arrays SUB_0 to SUB_7 may include edge areas EDGE, respectively. An edge area EDGE may indicate a part of a sub array adjacent to a logic circuit. Each of the sub arrays SUB_0 to SUB_7 may be disposed between logic circuits LC_0 to LC_8. For example, the sub array SUB_0 may be disposed between the logic circuits LC_0 and LC_1, and the sub array SUB_1 may be disposed between the logic circuits LC_1 and LC_2. Since a physical structure of a logic circuit is different from that of a sub array, an error may be generated at memory cells disposed at an edge area EDGE due to a process problem (e.g., a lithography problem based on a high difference between a sub array and a logic circuit). For exemplary embodiments, an error may be repetitively generated at memory cells of the edge areas EDGE of the arrays SUB_0 to SUB_7.

Figure 3:
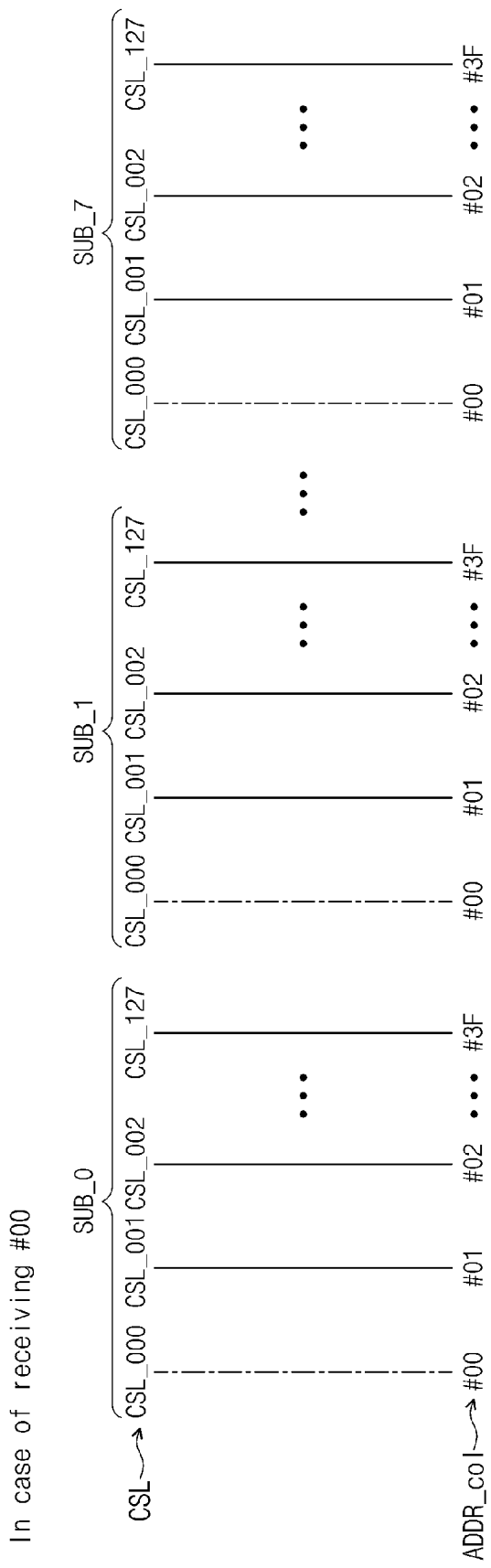
FIG. 3 is a diagram for describing an operation of a column decoder in FIG. 1.

FIG. 3 is a diagram for describing an operation of a column decoder in FIG. 1. Referring to FIG. 3, a column decoder 14 may select column selection lines CSL in response to a column address ADDR_col. One column selection line may select one (or, a pair) of a plurality of bit lines in each of the sub arrays SUB_0 to SUB_7. The column decoder 14 may select one column selection line in each of the sub arrays SUB_0 to SUB_7 with respect to one column address. For example, the column decoder 14 may select column selection lines CSL_000 (marked by a dotted line in FIG. 3) in response to a column address #00. The selected column selection lines CSL_000 may be lines for selecting $0^{th}$ bit lines of a plurality of bit lines included in the respective sub arrays SUB_0 to SUB_7. The $0^{th}$ bit lines may be bit lines having the same relative physical locations in the sub arrays SUB_0 to SUB_7. A physical location may indicate a location of a bit line on a sub array. For example, the $0^{th}$ bit lines may be bit lines disposed at edge areas EDGE.

As described with reference to FIG. 2, memory cells disposed at edge areas EDGE of the sub arrays SUB_0 to SUB_7 may be more prone to errors. It is assumed that bit lines corresponding to specific addresses (e.g., #00, #3F, etc.) are disposed at edge areas EDGE. If such bit lines are selected, data output from the sub arrays SUB_0 to SUB_7 may include a multi-bit error. In this case, it may be impossible to correct/recover the output data.

Figure 4:
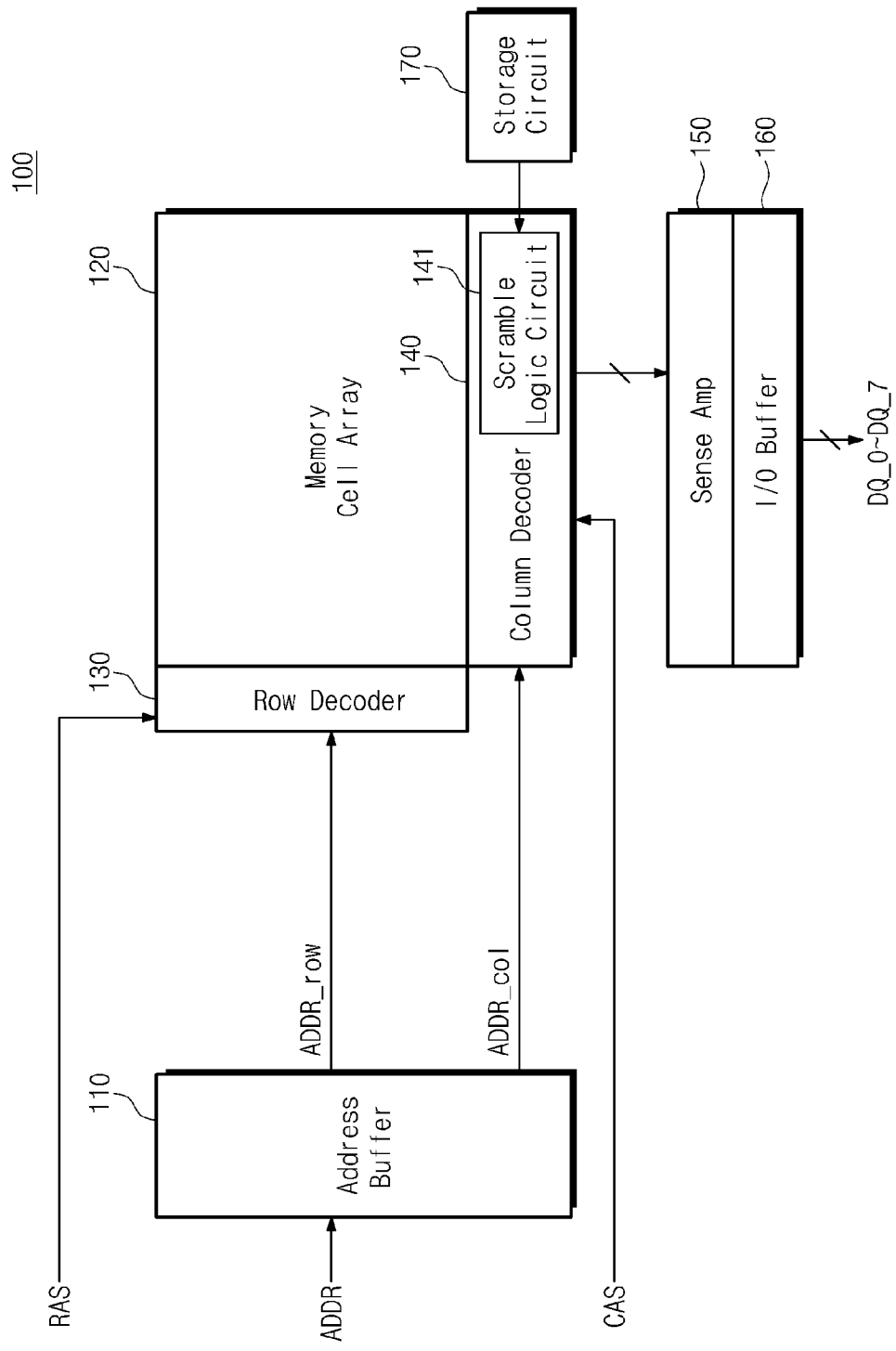
FIG. 4 is a block diagram schematically illustrating a memory device according to exemplary embodiments.

FIG. 4 is a block diagram schematically illustrating a memory device according to exemplary embodiments. Referring to FIG. 4, a memory device 100 may include an address buffer 110, a memory cell array 120, a row decoder 130, a column decoder 140, a sense amplifier 150, an input/output buffer 160, and a storage circuit 170. The column decoder 140 may include a scramble logic circuit 141. The components 110 to 160 in FIG. 4 may be substantially the same as that described with reference to FIG. 1, and a description thereof is thus omitted. Unlike a memory device 10 in FIG. 1, the memory device 100 in FIG. 4 may further comprise the scramble logic circuit 141 and the storage circuit 170. Below, a difference between the memory device 10 of FIG. 1 and the memory device 100 of FIG. 4 will be mainly described.

The scramble logic circuit 141 may receive a column address ADDR_col from the address buffer 110. The scramble logic circuit 141 may select column selection lines CSL in response to the column address ADDR_col. For example, relative physical locations of selected column selection lines of sub arrays SUB_0 to SUB_7 may be different from one another. A physical location may indicate a physical location of bit line on a sub array. The selected column selection lines may have different offset values with respect to the sub arrays SUB_0 to SUB_7. Here, an offset value may indicate a difference between physical locations of activated bit lines of the sub arrays SUB_0 to SUB_7. The scramble logic 141 circuit will be more fully described with reference to FIGS. 5 and 6.

The storage circuit 170 may store offset information used by the scramble logic circuit 141. For exemplary embodiments, the storage circuit 170 may include information associated with offset values respectively corresponding to the sub arrays SUB_0 to SUB_7. For example, offset information stored in the storage circuit 170 may be reconfigurable by an external device (e.g., a memory controller, a CPU, a host, etc.).

The scramble logic circuit 141 may operate based on predetermined offset values with respect to the sub arrays SUB_0 to SUB_7. For example, the scramble logic circuit 141 may be implemented by hardware such that predetermined offset values are applied to the sub arrays SUB_0 to SUB_7, respectively.

Figure 5:
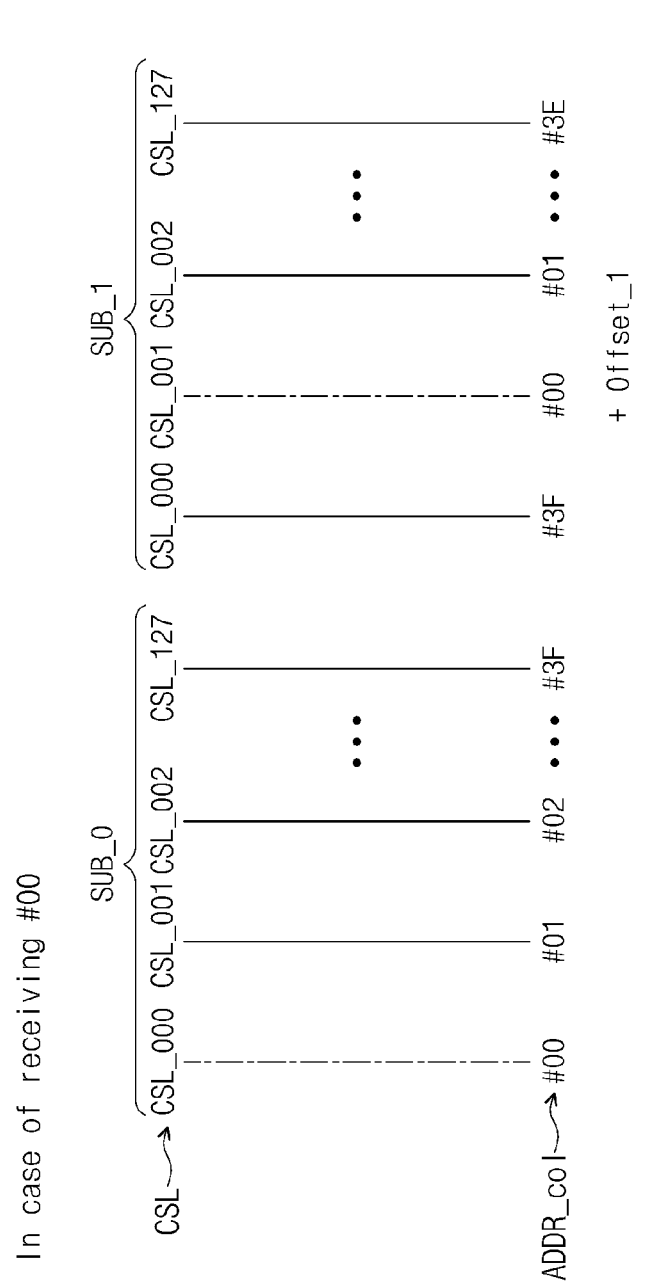
FIGS. 5 and 6 are exemplary diagrams for describing an operation of a scramble logic circuit in FIG. 4 according to one embodiment.
Figure 6:
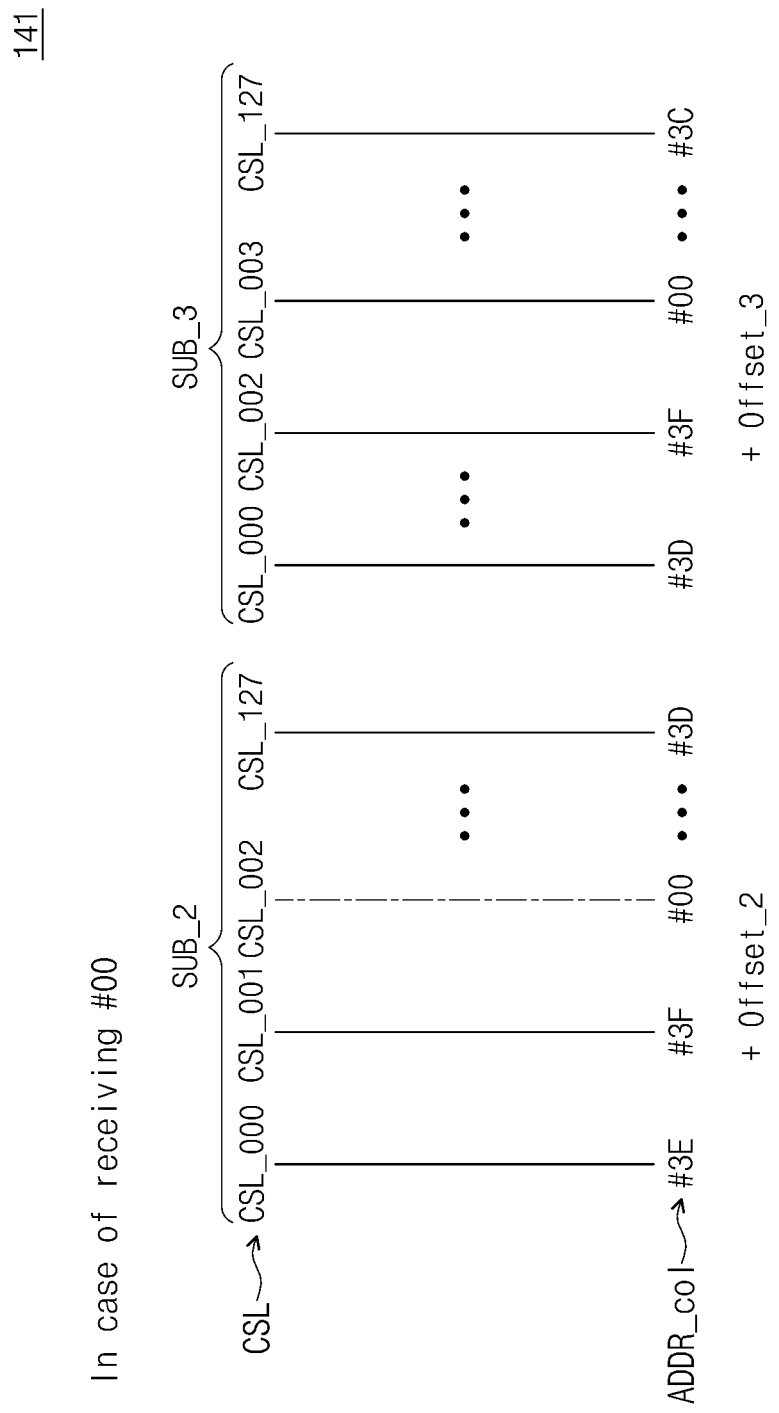

FIGS. 5 and 6 are exemplary diagrams for describing an operation of a scramble logic circuit in FIG. 4 according to one embodiment. In FIGS. 5 and 6, an operation of the scramble logic circuit 141 will be described under assumption that a memory device 100 receives a column address #00. However, the disclosure is not limited thereto. The scramble logic circuit 141 may perform in the same manner with respect to column addresses #01 to #3F other than the column address #00. Although not shown in FIGS. 5 and 6, the scramble logic circuit 141 may select column selection lines using different offset values with respect to other sub arrays SUB_4 to SUB_7.

Referring to FIG. 5, the scramble logic circuit 141 may receive the column address #00. The scramble logic circuit 141 may select a column selection line CSL_000 of a sub array SUB_0 corresponding to the column address #00. The scramble logic circuit 141 may select a column selection line CSL_001 of a sub array SUB_1. A difference between the column selection line CSL_000 and the column selection line CSL_001 may correspond to a first offset Offset_1. In other words, the scramble logic circuit 141 may select the $0^{th}$ and $1^{st}$ column selection line CSL_000 and CSL_001 of the sub arrays SUB_0 and SUB_1 corresponding to bit lines having different physical locations in response to the $0^{th}$ column address #00. For example, the scramble logic circuit 141 may apply the first offset Offset_1 when a column selection line of the sub array SUB_1 is selected in order to select column selection lines corresponding to bit lines having different relative physical locations in the sub arrays SUB_0 and SUB_1.

Referring to FIG. 6, the scramble logic circuit 141 may receive the column address #00. The scramble logic circuit 141 may select a column selection line CSL_002 of a sub array SUB_2. A difference between the column selection line CSL_000 and the column selection line CSL_002 may correspond to a second offset Offset_2. In other words, the scramble logic circuit 141 may select the $0^{th}$ and $2^{nd}$ column selection line CSL_000 and CSL_002 of the sub arrays SUB_0 and SUB_2 corresponding to bit lines having different physical locations in response to the $0^{th}$ column address #00. At this time, the scramble logic circuit 141 may apply the second offset Offset_2 when a column selection line of the sub array SUB_2 is selected in order to select column selection lines corresponding to bit lines having different relative physical locations in the sub arrays SUB_0 and SUB_2.

Likewise, the scramble logic circuit 141 may select a column selection line CSL_003 of a sub array SUB_3. A difference between the column selection line CSL_000 and the column selection line CSL_003 may correspond to a third offset Offset_3.

Although not shown in figures, the scramble logic circuit 141 may apply different offset values to sub arrays SUB_3 to SUB_7 to select column selection lines. Accordingly, the selected column selection lines may correspond to bit lines of the sub arrays SUB_0 to SUB_7 having different relative physical locations in the sub arrays SUB_0 to SUB_7.

In exemplary embodiments, the first to third offset values Offset_1 to Offset_3 in FIGS. 5 and 6 may have values sequentially increasing. However, the disclosure is not limited thereto. Offset values respectively corresponding to the sub arrays SUB_0 to SUB_7 may be randomly set values. Alternatively, offset values respectively corresponding to the sub arrays SUB_0 to SUB_7 may be set based on a pre-set pattern or order.

In case of an operation described with reference to FIG. 3, bit lines of SUB_0 to SUB_7 corresponding to column selection lines selected according to an input column address ADDR_col may have the same relative physical location in each of the sub arrays SUB_0 to SUB_7. On the other hand, in case of an operation described with reference to FIGS. 5 and 6, bit lines of SUB_0 to SUB_7 corresponding to column selection lines selected according to an input column address ADDR_col may have different relative physical locations in each of the sub arrays SUB_0 to SUB_7. For example, a memory device 100 of the embodiments described with reference to FIGS. 4 to 6 may not select bit lines (e.g., bit lines disposed at edge areas) having the same relative physical locations at the same time.

With the above description, bit lines disposed at edge areas of sub arrays may not be activated together. For example, although an error is repetitively generated at an edge area EDGE, data output from the memory device 100 may not include a multi-bit error. Also, since a data error detecting and recovering operation is minimized, the performance of the memory device may be improved.

Figure 7:
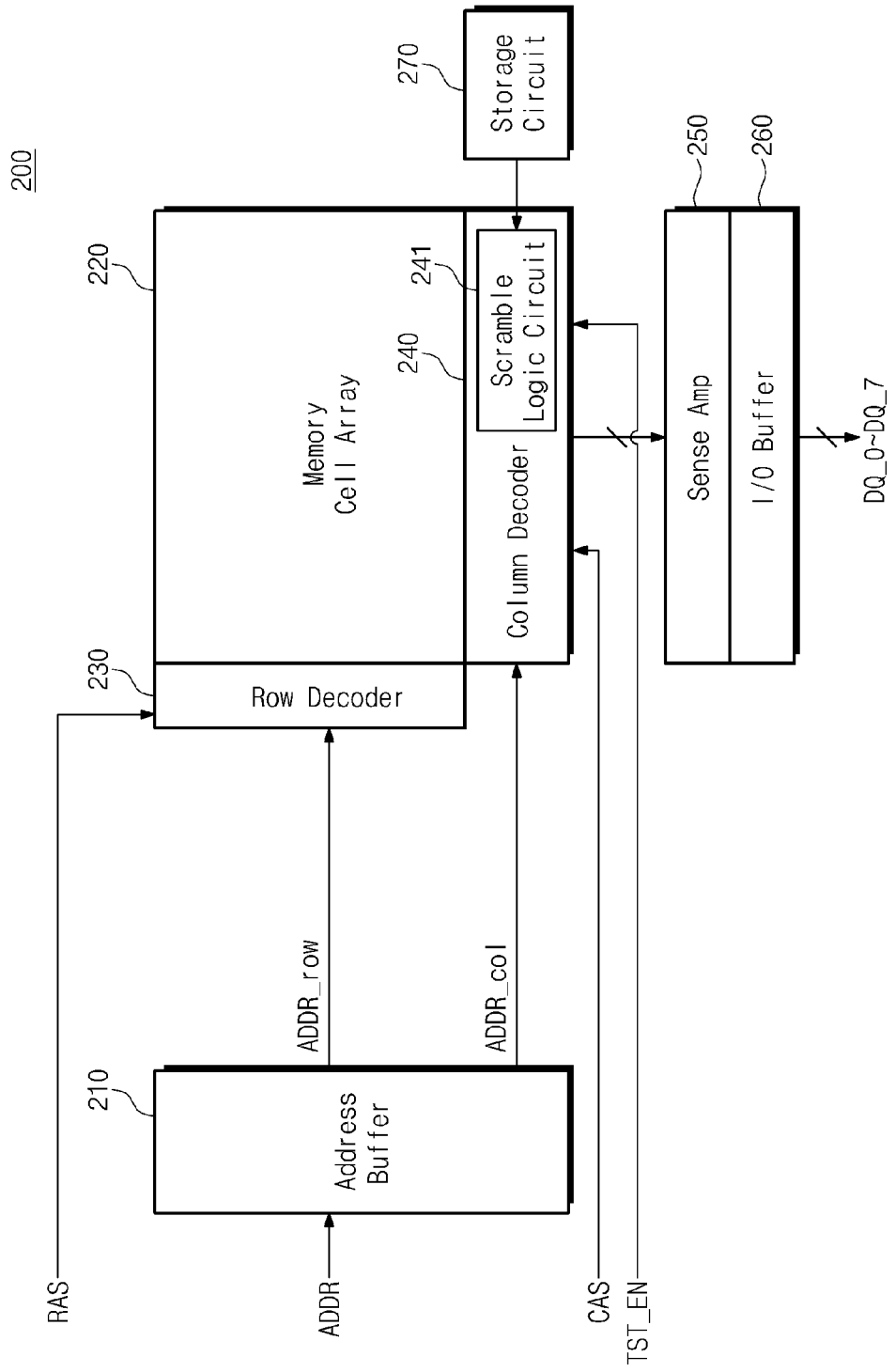
FIG. 7 is an exemplary block diagram schematically illustrating a memory device according to exemplary embodiments.

FIG. 7 is an exemplary block diagram schematically illustrating a memory device according to exemplary embodiments. Referring to FIG. 7, a memory device 200 may include an address buffer 210, a memory cell array 220, a row decoder 230, a column decoder 240, a sense amplifier 250, an input/output buffer 260, and a storage circuit 270. The column decoder 240 may include a scramble logic circuit 241. Unlike a memory device 100 of FIG. 4, the memory device 200 of FIG. 7 may operate based on a test signal TST_EN. Below, a difference between the memory device 100 of FIG. 4 and the memory device 200 of FIG. 7 will be mainly described.

The scramble logic circuit 241 may receive the test signal TST_EN from an external device (not shown). The scramble logic circuit 241 may operate in response to the test signal TST_EN. The test signal TST_EN may be a signal indicating information of a test operation of the memory device 200. For example, in the event that the memory device 200 performs a test operation, the test signal TST_EN may have a logic high level. In this case, the scramble logic circuit 241 may select a column selection line based on an operating method described with reference to FIG. 3. In other words, the scramble logic circuit 241 may not apply different offset values to a plurality of sub arrays SUB_0 to SUB_7 during a test operation.

On the other hand, in the event that the memory device 200 does not perform a test operation, the test signal TST_EN may have a logic low level. In this case, the scramble logic circuit 241 may select column selection lines based on an operating method described with reference to FIGS. 5 and 6. For example, the scramble logic circuit 241 may select column selection lines respectively corresponding to bit lines of the sub arrays SUB_0 to SUB_7 having different relative physical locations in the sub arrays SUB_0 to SUB_7. As such, the scramble logic circuit 241 may select column selection lines by applying different offset values with respect to the sub arrays SUB_0 to SUB_7.

Figure 8:
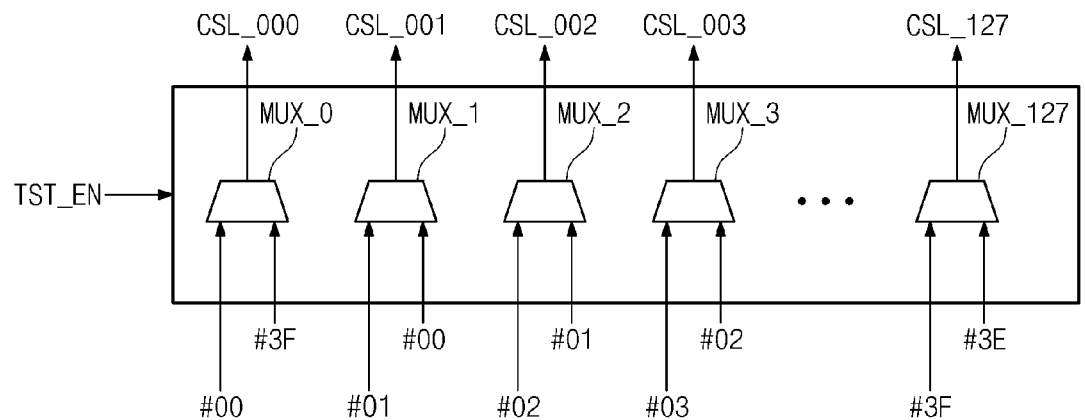
FIG. 8 is an exemplary block diagram schematically illustrating a scramble logic circuit of FIG. 7 according to one embodiment.

FIG. 8 is an exemplary block diagram schematically illustrating a scramble logic circuit of FIG. 7 according to one embodiment. The scramble logic circuit 241 may include a plurality of scramble logic circuits respectively corresponding to a plurality of sub arrays. Different offset values may be applied to the scramble logic circuits, respectively. For ease of description, it is assumed that a scramble logic circuit 241a corresponds to a first sub array SUB_1. Also, the remaining scramble logic circuits may perform the same operation based on an operation of the scramble logic circuit 241a.

Referring to FIG. 8, the scramble logic circuit 241a may include a plurality of multiplexers MUX_0 to MUX_127. The multiplexers MUX_0 to MUX_127 may operate based on a test signal TST_EN. The multiplexers MUX_0 to MUX_127 may correspond to different column selection lines CSL_000 to CSL_127, respectively. Different column addresses may be applied to the multiplexers MUX_0 to MUX_127, respectively. For example, the $0^{th}$ multiplexer MUX_0 may receive two column addresses of #00 and #3F and the $1^{th}$ multiplexer MUX_1 may receive two column addresses of #01 and #00. For example, when a memory device 200 receives a column address of #00 under a test mode (e.g., when the test signal TST_EN has logic high level), a $0^{th}$ multiplexer MUX_0 may select the column address #00. In this case, the $0^{th}$ multiplexer MUX_0 may select a column selection line CSL_000 in response to the column address of #00. On the other hand, when the memory device 200 receives a column address of #00 under a normal mode (e.g., when the test signal TST_EN has logic low level), a $1^{st}$ multiplexer MUX_1 may select the column address of #00. In this case, the $1^{st}$ multiplexer MUX_1 may select a column selection line CSL_001 in response to the column address of #00.

For example, the scramble logic circuit 241a may select a column selection line based on the test signal TST_EN and an input column address ADDR_col. In one embodiment, the scramble logic circuit 241a may determine whether to apply an offset value according to the test signal TST_EN.

With the above description, since bit lines placed at edge areas EDGE of sub arrays may not be selected simultaneously, a data error may be minimized. Also, since the scramble logic circuit operates according to the test signal TST_EN, it is possible to secure a test operation of a memory device.

Figure 9:
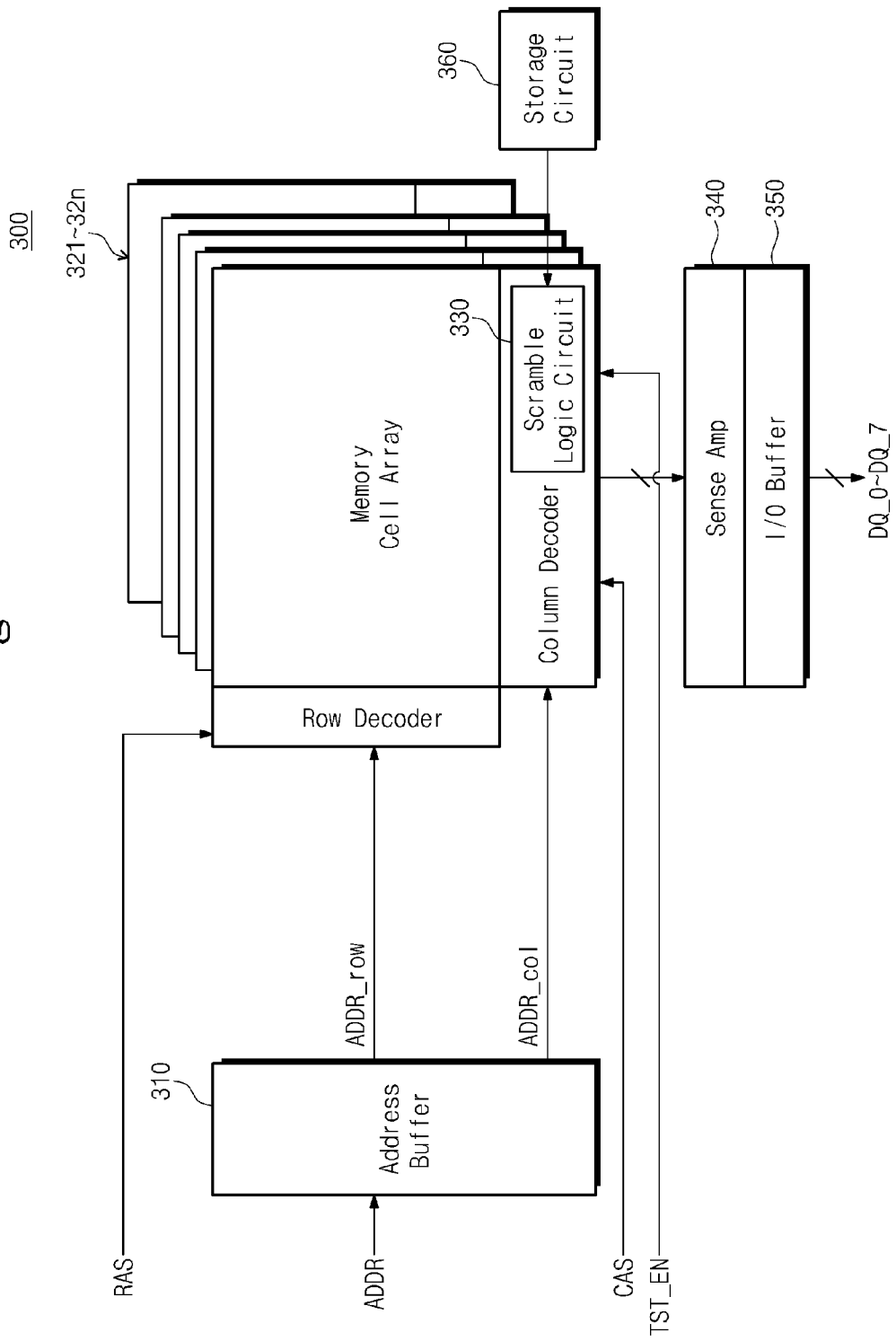
FIG. 9 is an exemplary block diagram schematically illustrating a memory device according to certain exemplary embodiments.

FIG. 9 is an exemplary block diagram schematically illustrating a memory device according to certain exemplary embodiments. Referring to FIG. 9, a memory device 300 may include an address buffer 310, a plurality of banks 321 to 32n, a sense amplifier 340, an input/output buffer 350, and a storage circuit 360.

Each of the banks 321 to 32n may include a row decoder, a column decoder, and a memory cell array. The column decoders in the banks 321 to 32n may scramble logic circuits 330, respectively. The memory device 300 may select one of the banks 321 to 32n to perform an operation described with reference to FIGS. 1 to 8. For example, when receiving a row address ADDR_row from an external device (not shown), the memory device 300 may receive a bank selection signal together. The memory device 300 may select one of the banks 321 to 32n based on the bank selection signal. As described with reference to FIGS. 4 to 8, each of the scramble logic circuits 330 included in a column decoder of each of the banks 321 to 32n may select a column selection line having a different offset value such that a bit line having a different relative physical location is selected.

Figure 10:
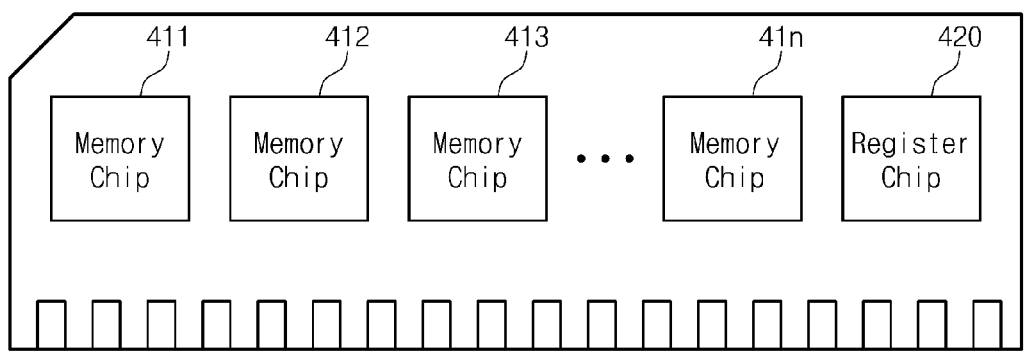
FIG. 10 is an exemplary block diagram schematically illustrating a memory module according to certain embodiments.

FIG. 10 is an exemplary block diagram schematically illustrating a memory module according to certain embodiments. Referring to FIG. 10, a memory module 400 may include a plurality of memory chips 411 to 41n and a register chip 420. Each of the memory chips 411 to 41n may be formed of a memory device described with reference to FIGS. 4 to 9.

The memory module 400 may set the memory chips 411 to 41n to have different offset values for each of the memory chips. For example, each of the memory chips 411 to 41n may include a scramble logic circuit. The memory module 400 may set offset information such that different offset values are applied to scramble logic circuits in the memory chips 411 to 41n. Each of the memory chips 411 to 41n may select column selection lines based on the different offset values. For example, bit lines corresponding to selected column selection lines may have different relative physical locations for different memory chips.

The register chip 420 may receive an address, a control signal, and data to send them to each of the memory chips 411 to 41n. For example, the register chip 420 may adjust offset information stored in storage circuits of the memory chips 411 to 41n. For example, the register chip 420 may receive offset information of the memory chip 400 or the respective memory chips 411 to 41n from an external device. The register chip 420 may send the offset information to the storage circuits of the memory chips 411 to 41n. Alternatively, the register chip 420 may adjust offset information of the storage devices included in the memory chips 411 to 41n based on predetermined offset information. The memory chips 411 to 41n may perform an operation described with reference to FIGS. 1 to 10 based on the offset information of the storage devices included in the memory chips 411 to 41n.

With the above description, the memory module 400 may include a plurality of memory chips, and may apply different offset values to the memory chips. Also, each of the memory chips may apply different offset values to sub arrays included in each of the memory chips. Thus, as different offset values are applied to sub arrays and memory chips, bit lines disposed at different physical locations in both the sub arrays and the memory chips may be selected. As a result, the performance and reliability of the memory module may be improved.

Figure 11:
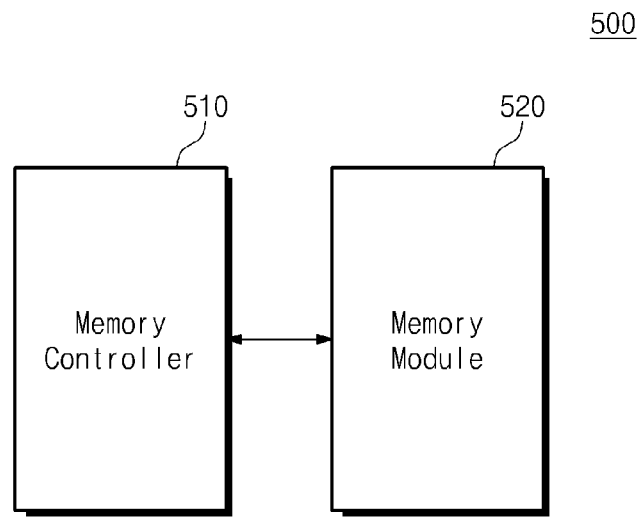
FIG. 11 is an exemplary block diagram schematically illustrating a memory system according to certain embodiments.

FIG. 11 is an exemplary block diagram schematically illustrating a memory system according to certain embodiments. Referring to FIG. 11, a memory system 500 may include a memory controller 510 and a memory module 520. The memory controller 510 may transfer control signals for controlling the memory module 520 and data to the memory module 520. The memory module 520 may have the same structure and perform the same operation as a memory module 400 of FIG. 10.

In example embodiments, the memory controller 510 may control offset values applied to a plurality of chips included in the memory module 520. For example, during booting of the memory system, the memory controller 510 may perform a mode register setting operation of the memory module 520. At this time, the memory controller 510 may send offset information applied to each of chips and sub arrays. For example, the memory module 520 may store the offset information at a storage circuit (not shown) included in the memory module 520. The memory module 520 may perform an operation described with reference to FIGS. 4 to 10 based on the offset information.

Figure 12:
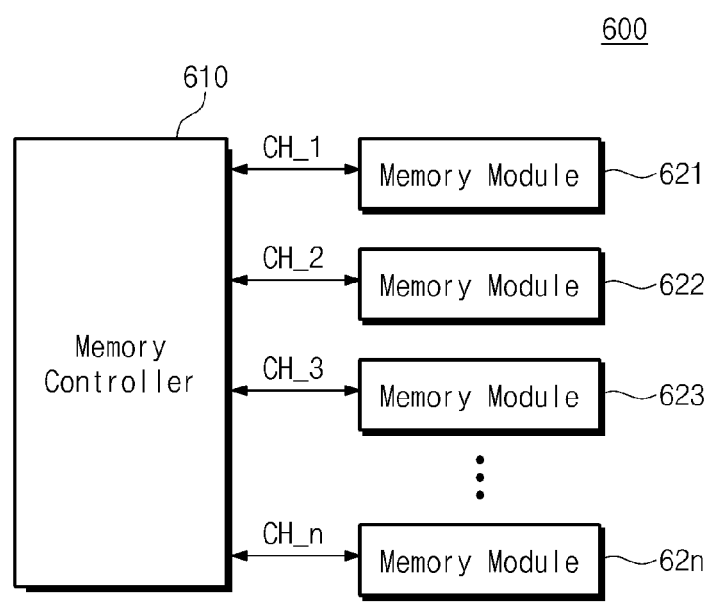
FIG. 12 is an exemplary block diagram schematically illustrating according to certain embodiments.

FIG. 12 is an exemplary block diagram schematically illustrating according to certain embodiments. Referring to FIG. 12, a memory system 600 may include a memory controller 610 and a plurality of memory modules 621 to 62n. The memory controller 610 may be connected to the memory modules 621 to 62n through channels CH1 to CHn, respectively. The memory controller 610 may transfer control signals and data to the memory modules 621 to 62n through the channels CH1 to CHn.

In example embodiments, the memory controller 610 may apply different offset values to the memory modules 621 to 62n. The memory modules 621 to 62n may select column selection lines based on a method described with reference to FIGS. 4 to 11.

The memory system and the memory device according to embodiments of the disclosure may apply different offset values to modules, memory chips, and sub arrays to select column selection lines. The reliability of data may be thus improved by preventing bit lines placed at the same relative physical locations from being selected with respect to a column address.

Figure 13:
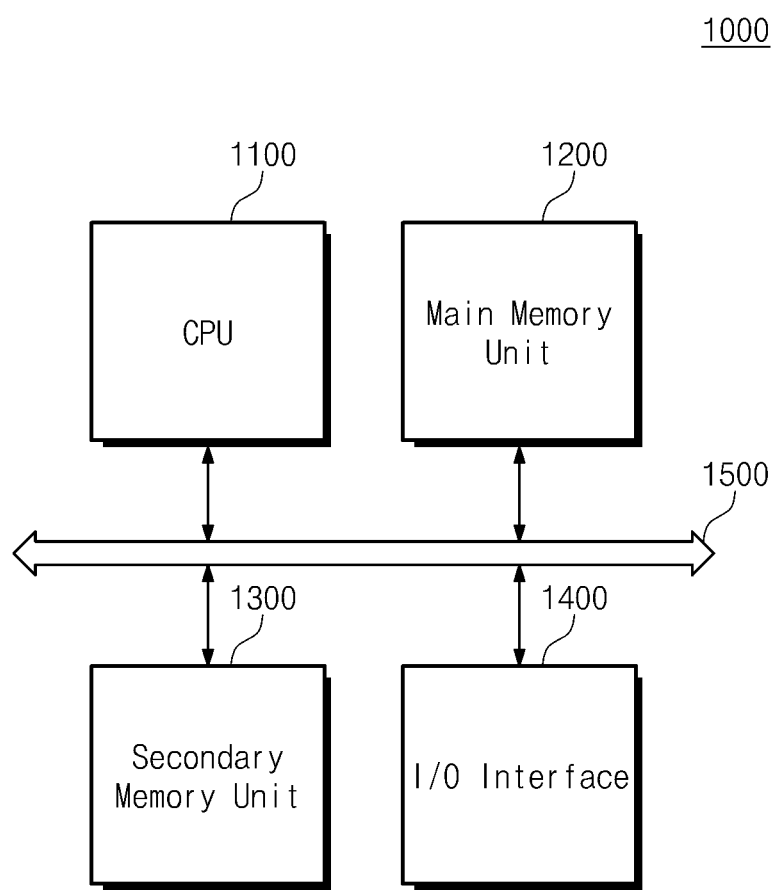
FIG. 13 is an exemplary block diagram schematically illustrating a user system according to certain embodiments.

FIG. 13 is an exemplary block diagram schematically illustrating a user system according to certain embodiments. Referring to FIG. 13, a user system 1000 may be one selected from computing systems such as a computer, a ultra-mobile personal computer (UMPC), a workstation, a net-book, a personal digital assistance (PDA), a portable computer (PC), a web tablet, a wireless phone, a mobile phone, a smart phone, an e-book, a portable multimedia player (PMP), a portable game console, a navigation device, a black box, a digital camera, a digital multimedia broadcasting (DMB) player, a digital audio recorder, a digital audio player, a digital picture recorder, a digital picture player, a digital video recorder, a digital video player, and so on.

The user system 1000 may include a CPU 1100, a main memory unit 1200, a secondary memory unit 1300, an input/output interface 1400, and a system bus 1500.

The CPU 1100 may control devices included in the user system 1000 and be configured to decode and execute commands.

The main memory unit 1200 may temporarily store programs to be executed by the CPU 1100 or data to buffer an operating speed between the CPU 1100 and the secondary memory unit 1300. The main memory unit 1200 may be a random access memory such as DRAM (Dynamic Random Access Memory), SDRAM (Synchronous DRAM), SRAM (Static RAM), DDR SDRAM (Double Date Rate SDRAM), DDR2 SDRAM, DDR3 SDRAM, PRAM (Phase-change RAM), MRAM (Magnetic RAM), RRAM (Resistive RAM) or the like. The main memory unit 1200 may include at least one of a memory device and a memory module described with reference to FIGS. 4 to 12.

The secondary memory unit 1300 may store programs or data. For example, the secondary memory unit 1300 may be formed of a mass storage device such as a hard disk drive, a solid state drive or the like.

The user interface 1400 may be an interface providing an input/output operation such that a user controls the user system 1000. The components 110 to 140 may be connected to the system bus 1500 as a data transfer channel.

While the present disclosure has been particularly shown and described with reference to exemplary embodiments thereof, it will be understood by those skilled in the art that various changes in form and detail may be made therein without departing from the spirit and scope of the present invention as defined by the following claims.

What is claimed is:

1. A memory device, comprising:
a memory cell array including a plurality of sub arrays each sub array having a plurality of memory cells connected to bit lines;
an address buffer configured to receive a row address and a column address; and
a column decoder configured to receive the column address from the address buffer and, for each of the sub arrays, to select a column selection line corresponding to the column address, from among a plurality of column selection lines, based on different offset values applied to the sub arrays, respectively,
wherein, for the sub arrays, the selected column selection lines correspond to bit lines having different physical locations, respectively, according to the different offset values.

2. The memory device of claim 1, wherein the column decoder is configured to operate in response to a test signal.

3. The memory device of claim 2, wherein if the test signal indicates a test mode, the column decoder is configured to select column selection lines corresponding to bit lines having the same relative physical location in each of the sub arrays.

4. The memory device of claim 1, wherein the memory cell array further includes a plurality of logic circuits, and wherein each of the sub arrays is disposed between adjacent logic circuits of the logic circuits.

5. The memory device of claim 4, wherein each of the sub arrays outputs data through one or more data lines.

6. The memory device of claim 1, wherein the different offset values applied to the sub arrays sequentially increase for consecutive sub arrays.

7. The memory device of claim 1, wherein the different offset values applied to the sub arrays are random values.

8. The memory device of claim 1, further comprising:
a storage circuit configured to store information on the different offset values,
wherein the column decoder is configured to select column selection lines corresponding to bit lines having different physical locations, respectively, according to information on different offset values stored at the storage circuit.

9. The memory device of claim 8, wherein the different offset values are provided to the storage circuit from an external device during booting of the memory device.

10. A memory system, comprising:
a plurality of memory modules each having a plurality of memory chips; and
a memory controller configured to control the memory modules through a plurality of channels, respectively,
wherein each of the memory chips is configured to select column selection lines corresponding to an address received from the memory controller,
wherein the selected column selection lines correspond to bit lines having different relative physical locations for different memory chips according to offset values, and
wherein the offset values on the memory chips have different values for different memory chips, respectively.

11. The memory system of claim 10, wherein the memory controller is configured to adjust the offset values.

12. The memory system of claim 11, wherein each of the memory chips comprises a plurality of sub arrays each having memory cells, the sub arrays having different offset values, respectively.

13. The memory system of claim 10, wherein each of the memory chips further comprises a storage circuit configured to store information about the offset values.

14. The memory system of claim 13, wherein during booting of the memory system, the memory controller is configured to transfer information about the offset values to the storage circuit.

15. The memory system of claim 13, wherein each of the memory modules further comprises a register chip configured to adjust the offset values of the storage circuit.

16. A memory device comprising:
a memory cell array including a plurality of sub arrays each having a plurality of memory cells connected to a plurality of bit lines; and
a column decoder configured to receive a column address and, in each of the sub arrays, to select a column selection line connected to a corresponding bit line,
wherein a relative physical location of the bit line corresponding to the selected column selection line within each of the sub arrays is different for different sub arrays.

17. The memory device of claim 16, wherein physical locations of the bit lines corresponding to the selected column selection lines are determined based on different offset values applied to the different sub arrays, respectively.

18. The memory device of claim 17, wherein the column decoder includes a scramble logic circuit configured to determine a location of the bit line corresponding to the selected column select line of each of the sub arrays based on the different offset values.

19. The memory device of claim 17, further comprising a storage circuit configured to store the offset values.

20. The memory device of claim 16, wherein each of the plurality of sub arrays is a memory bank.

* * * * *